United States Patent
Chhabra et al.

(10) Patent No.: US 12,035,517 B2
(45) Date of Patent: Jul. 9, 2024

(54) MULTI-TRANSISTOR STACK BITCELL ARCHITECTURE

(71) Applicant: Arm Limited, Cambridge (GB)

(72) Inventors: Amit Chhabra, Noida (IN); David Victor Pietromonaco, Cupertino, CA (US)

(73) Assignee: Arm Limited, Cambridge (GB)

( * ) Notice: Subject to any disclaimer, the term of this patent is extended or adjusted under 35 U.S.C. 154(b) by 164 days.

(21) Appl. No.: 17/125,683

(22) Filed: Dec. 17, 2020

(65) Prior Publication Data
US 2022/0199629 A1    Jun. 23, 2022

(51) Int. Cl.
| | | |
|---|---|---|
| H10B 10/00 | (2023.01) | |
| H01L 21/822 | (2006.01) | |
| H01L 21/8238 | (2006.01) | |
| H01L 23/528 | (2006.01) | |
| H01L 27/06 | (2006.01) | |
| H01L 27/092 | (2006.01) | |

(52) U.S. Cl.
CPC ..... *H10B 10/12* (2023.02); *H01L 21/823871* (2013.01); *H01L 23/528* (2013.01); *H01L 27/0922* (2013.01)

(58) Field of Classification Search
CPC ......... H01L 27/1104; H01L 21/823871; H01L 23/528; H01L 27/0922; H01L 21/8221; H01L 27/092; H01L 27/0688; H01L 27/1116; H10B 10/12; H10B 10/18; Y10S 257/903
See application file for complete search history.

(56) References Cited

U.S. PATENT DOCUMENTS

| | | | |
|---|---|---|---|
| 2015/0146476 A1* | 5/2015 | Zhang | G11C 11/419 365/189.16 |
| 2020/0075489 A1* | 3/2020 | Liebmann | H01L 21/823828 |
| 2020/0144264 A1* | 5/2020 | Li | H01L 21/823807 |
| 2021/0358849 A1* | 11/2021 | Chen | H01L 21/823475 |

* cited by examiner

*Primary Examiner* — Herve-Louis Y Assouman
(74) *Attorney, Agent, or Firm* — Pramudji Law Group PLLC; Ari Pramudji

(57) ABSTRACT

Various implementations described herein are related to a device having multiple transistors in a single stack arranged as a cross-coupled bitcell latch. Also, the multiple transistors may be disposed in a multi-transistor stack configuration that is formed within a single monolithic semiconductor die. In some implementations, the multiple transistors may be arranged as a bitcell for single-port memory applications.

17 Claims, 10 Drawing Sheets

MULTI-TRANSISTOR STACK BITCELL ARCHITECTURE

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some modern bitcell architecture, conventional multi-transistor devices utilize traditional layout techniques and thus suffer from low density design application that may typically cause unintended consequences in fabrication processes. Therefore, traditional layout techniques can be inefficient, density deficient and typically fail to provide sufficient means for implementing various different layout configurations. Thus, there exists a need to improve traditional layout techniques that allow for efficient device fabrication.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to fabrication schemes and techniques for single-port memory applications in physical layout designs. In some instances, the various schemes and techniques described herein may provide for various single-port static random access memory (SRAM) bitcell architectures using multi-stack complementary field-effect transistor (FET) technology. Also, various bitcell fabrication schemes and techniques described herein may provide for a novel architecture in physical layout design of bitcell architecture of multi-transistor (e.g., 6T) single-port SRAM bitcells in the stacked complementary FET technology, wherein multiple devices are disposed one on top of each other in a single stack configuration. Also, the various multi-transistor bitcell fabrication schemes and techniques described herein provide for varying different multi-transistor stack combinations of devices to be manufactured at the same time and within the same, single monolithic semiconductor die.

In some implementations, bitcell fabrication schemes and techniques described herein utilize technology that supports complimentary FET (CFET) devices, wherein each device is fabricated with nano-sheets (NS) or Fin-FET devices that are used to form multiple devices in multi-transistor stacks within a single monolithic semiconductor die with devices stacked on top of each other in a single multi-transistor stack. Therefore, the various bitcell fabrication schemes and techniques described herein may provide for different stack configurations, such as, e.g., multiple N-type structures and multiple P-type structures stacked in various multi-transistor stack configurations, such as P-over-P-over-N-over-N stack configuration, N-over-P-over-P-over-N stack configuration, P-over-N-over-N-over-P stack configuration and P-over-N-over-P-over-N stack configuration. In various implementations, gates for P-type FET (PFET) devices and N-type FET (NFET) devices may have common-gate or split-gate architecture. Further, the bitcell fabrication schemes and techniques described herein also use technology that supports N-over-P devices and/or P-over-N devices or N-over-N and/or P-over-P stack configurations within the same single monolithic semiconductor die in various bitcell related applications.

Various implementations of providing various multi-transistor bitcell architecture will be described herein with reference to FIGS. 1-5. Also, the various bitcell fabrication schemes and techniques described herein may be configured to provide for 6T bitcells in a four-device-stacked FET technology for physical layout design applications.

Figure 1A:
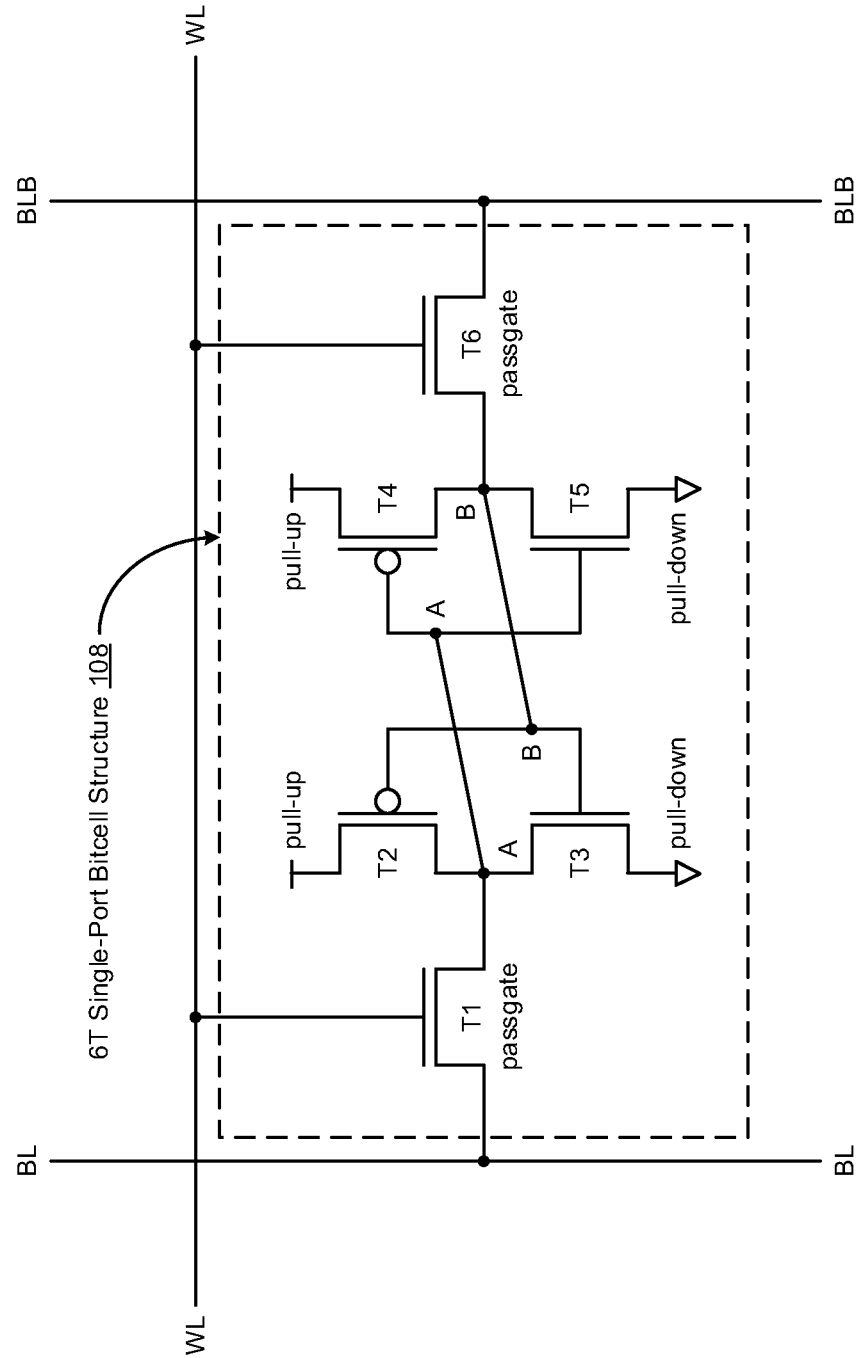
FIG. 1A illustrates a diagram of bitcell architecture in accordance with various implementations described herein.

FIG. 1A illustrates a diagram 100A of bitcell architecture 104A in accordance with various implementations described herein.

In some implementations, the bitcell architecture 104A may be implemented as a system or a device having various integrated circuit (IC) components that are arranged and coupled together as an assemblage or combination of parts that provide for physical circuit designs and various related structures. In some instances, a method of designing, providing and building the bitcell architecture 104A as an integrated system or device may involve use of various IC circuit components described herein so as to thereby implement fabrication schemes and techniques associated therewith. Also, the bitcell architecture 104A may be integrated with computing circuitry and related components on a single chip, and the bitcell architecture 104A may be implemented in various embedded systems for automotive, electronic, mobile, server and Internet-of-Things (IoT) applications.

As shown in FIG. 1A, the bitcell architecture 104A may be implemented with a bitcell related structure 108, such as, e.g., a multi-transistor bitcell structure. For instance, in some implementations, the multi-transistor bitcell structure 108 may be configured as a multi-transistor (e.g., six transistors (6T)) single-port SRAM bitcell structure, wherein the six-transistors (6T) include multiple (e.g., 4) N-type metal-oxide-semiconductor (NMOS) transistors and multiple (e.g., 2) P-type MOS (PMOS) transistors. In some instances, a passgate transistor (T1) may be coupled between a first bitline (BL) and a node (A), and another passgate transistor (T6) may be coupled between a second bitline (BLB) and a node (B), wherein the second bitline (BLB) is complementary to the first bitline (BL). Also, a wordline (WL) may be coupled to the gates of transistors (T1, T6) to access data stored in the latch that is formed with multiple transistors (T2, T3, T4, T5) via the wordline (WL) and complementary bitlines (BL, BLB).

Transistors (T2, T3) may be coupled in series between voltage supply (Vdd) and ground (Gnd or Vss), wherein the node (A) is formed between pull-up transistor (T2) and pull-down transistor (T3). Also, transistors (T4, T5) may be coupled in series between voltage supply (Vdd) and ground (Gnd or Vss), wherein the node (B) is formed between pull-up transistor (T4) and pull-down transistor (T5). Further, transistors (T2, T3) may be cross-coupled with transistors (T4, T5) such that the node (A) is coupled to the gates of transistors (T4, T5) and such that the other node (B) is coupled to the gates of transistors (T2, T3). In some instances, transistors (T2, T4) may refer to P-type field-effect transistors (PFET), and transistors (T1, T3, T5, T6) refer to N-type FET (NFET) transistors. However, various other configurations may be used to achieve similar results and/or behavior.

Figure 2A:
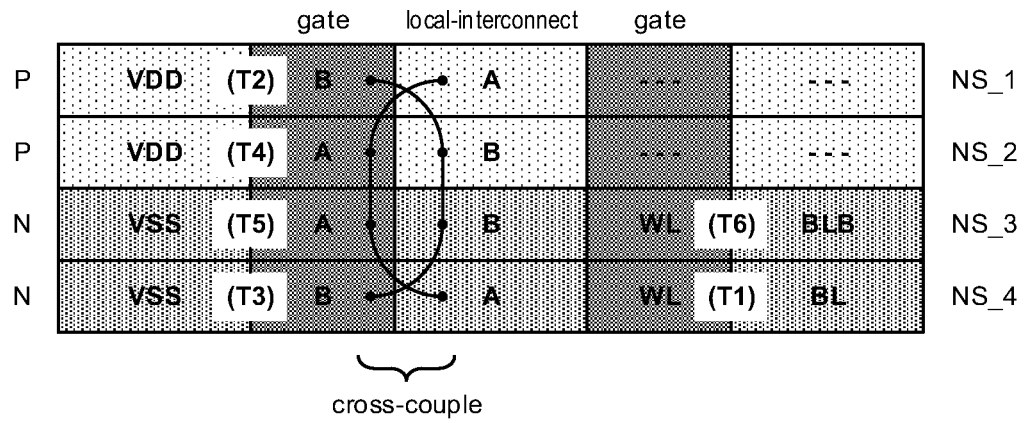
FIGS. 2A-2D illustrate various diagrams of multi-transistor stack architecture in accordance with various implementations described herein.

In some implementations, in reference to FIG. 1A, nodes (A, B) refer to internal nodes for routing that may be routed on the sides of the multi-transistor stack in a physical layout design thereof, wherein the nodes (A, B) may not physically cross. Also, as shown in FIG. 2A, the two PFET dummy cells (- - -) may be used to separate the internal nodes (A, B) between the other FET cells. Also, the two PFET dummy cells are disposed on the top of the multi-transistor stack so as simplify device fabrication.

Figure 1B:
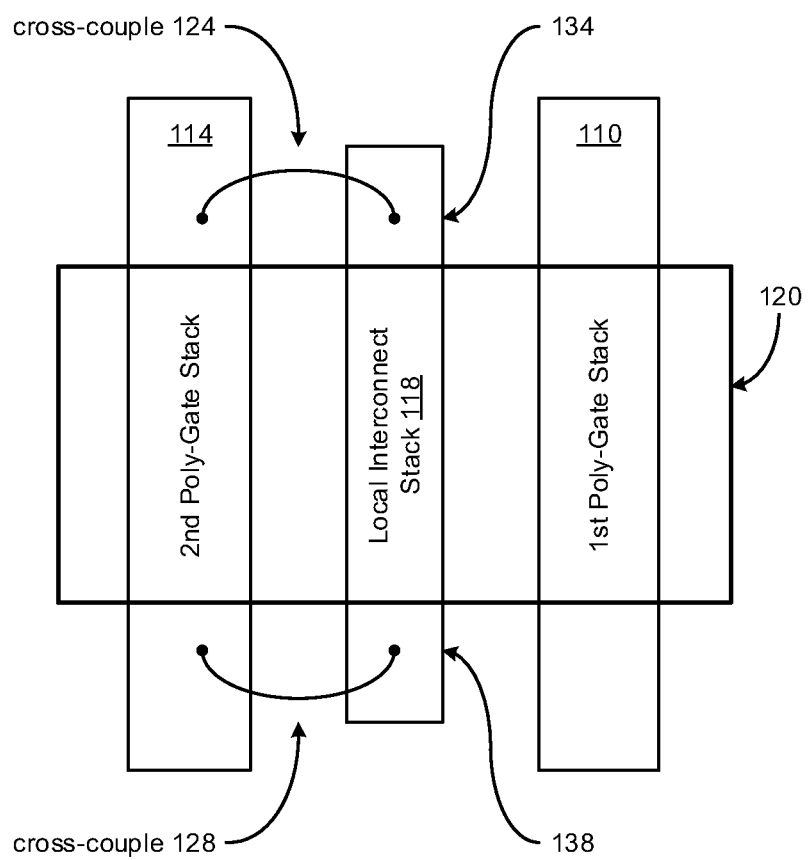
FIG. 1B illustrates a diagram of multi-transistor architecture in accordance with various implementations described herein.

FIG. 1B illustrates a diagram 100B of multi-transistor architecture 104B in accordance with various implementations described herein. In various implementations, the multi-transistor architecture 104B shown in FIG. 1B along with various components related thereto are associated to the bitcell architecture 104A shown in FIG. 1A.

As shown in FIG. 1B, the multi-transistor architecture 104B refers to a cross-coupling on a side of a multi-transistor stack. The multi-transistor architecture 104B has a first poly-gate stack 110 for transistors (T1, T6) and a second poly-gate stack 114 for transistors (T2, T3, T4, T5). The multi-transistor architecture 104B has a source/drain diffusion region 120 for transistors (T1-T6). Also, the multi-transistor architecture 104B may have a local interconnect stack 118 that provides a connection to the diffusion for node A and that provides a connection to the diffusion for node B. In some implementations, the first poly-gate stack 110 may have a first stack of 4 transistors, such as, e.g., 4P, 4N, 2P/2N, or 2N only with 2P as dummy cells. Also, the second poly-gate stack 114 may have a second stack of 4 transistors, such as, e.g., 4P, 4N or 2P/2N. Moreover, the multi-transistor architecture 104B may have a one or more cross-couple connections between various components, such as, e.g., a first cross-couple 124 that connects diffusion A to poly-gate B and a second cross-couple that connects diffusion B to poly-gate A. These concepts along with various other features, behaviors and characteristics are described in greater detail herein below in reference to FIGS. 2A-2D and 3A-3D.

Moreover, in various implementations, in reference to FIG. 1A, the bitcell architecture 104A may be implemented with one or more core arrays of bitcells or memory cells, wherein each bitcell may be configured to store at least one data-bit value (e.g., data value related to a logical '0' or '1'). The one or more core arrays may include any number of bitcells arranged in various configurations, such as, e.g., two-dimensional (2D) memory arrays having any number of columns and any number of rows of multiple bitcells, which may be arranged in a 2D grid pattern for read and write memory access. However, even though SRAM bitcell structure is shown and described in FIG. 1A, any other type of bitcell structure may be used to achieve similar results of the various bitcell fabrication techniques disclosed herein. Thus, in various instances, each bitcell may be implemented with any type of memory, including, e.g., magneto-resistive RAM (MRAM) and/or any other type of useable memory.

In some implementations, various bitcell fabrication schemes and techniques described herein provide for multiple arrangements of a device stack that are used to form a six-transistor SRAM bitcell (6T) in the NPPN/PNNP/NNPP stacked technologies. Also, the arrangement provides for fabricating two bitcells in twice the footprint using top-2 and bottom-2 stacks that are independent of each other. In some embodiments, the 6T bitcell may be made in two poly pitches, which provides eight devices in the four-stacked-device technologies. In this embodiment, the four devices may be fabricated within a single poly pitch and used to form a cross-couple inverter pair. The transistor stacking may refer to NPPN (N-over-P-over-P-over-N) or PNNP (P-over-N-over-N-over-P). The consecutive poly has PMOS etched out (or it is left dummy) to form a passgate pair for the bitline pair, which is described herein below in reference to FIGS. 2A-2D and 3A-3D.

Also, in another embodiment, the transistor arrangement may refer to a P-over-P-over-N-over-N (PPNN), wherein the two inverters may be formed by one of the following techniques. For instance, the top-most and the bottom-most transistors may be used to form one inverter, and the middle transistors may be used to form another inverter. Also, in another instance, alternating transistors in the stack may be used to form each inverter of the two inverters. Thus, the cross-couple arrangement may be formed from the sides thereof as described herein below in reference to FIGS. 2A-2D and 3A-3D.

Also, in another embodiment, the cross-coupled inverters may be formed in two consecutive polys, wherein one inverter is made in the first poly using the top two devices in the stack, and wherein the other cross-coupled inverter is made in the consecutive poly using the bottom two devices in the stack. The remaining two PMOS devices in the eight-device stack may be removed (etched out) so as to provide space, which may be used to make the cross-couple connections, such as, e.g., connecting the input of one inverter to the output of the other inverter. The remaining NMOS devices may be used as passgate devices, wherein the entire structure may be flipped to share the bitlines (BL, BLB), such as, e.g., from the outputs of the passgate devices. Also, metal connections to the bitlines may be swapped between the bitlines to balance capacitance. Other features related to these techniques is described herein below in FIGS. 2A-2D and 3A-3D.

Figure 2B:
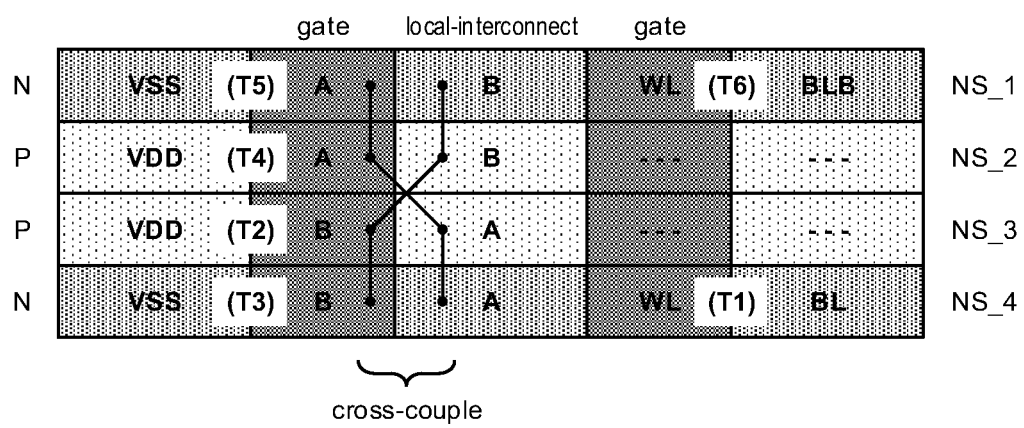
Figure 2C:
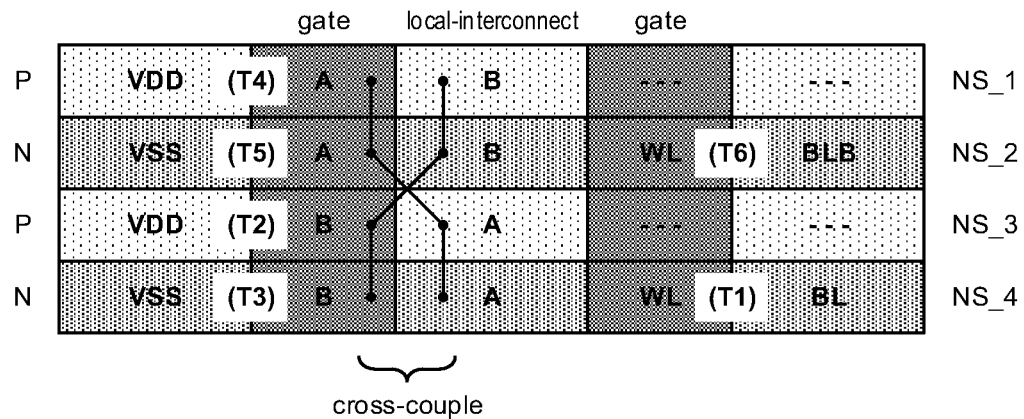
Figure 2D:
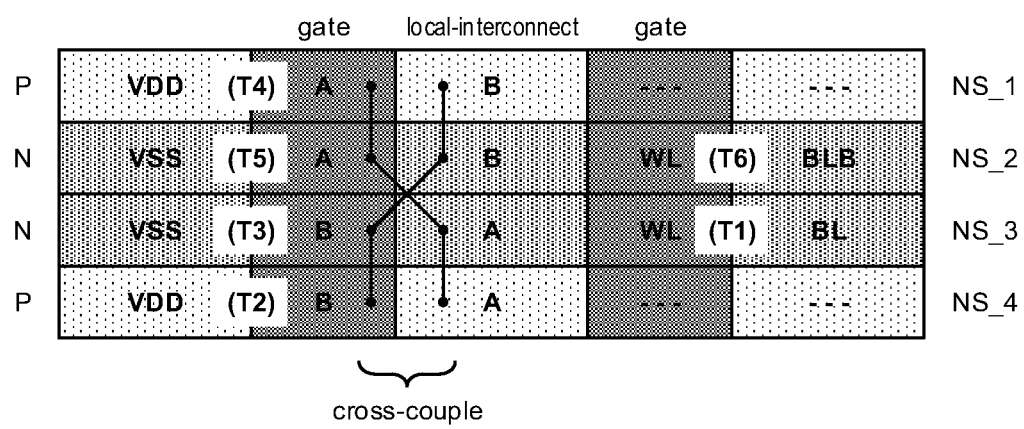

FIGS. 2A-2D illustrate various diagrams of multi-transistor stack architecture in accordance with various implementations described herein. For instance, in particular, FIG. 2A shows a side-view diagram 200A of multi-transistor PPNN stack architecture 204A, FIG. 2B shows another side-view diagram 200B of multi-transistor NPPN stack architecture 204B, FIG. 2C shows another side-view diagram 200C of multi-transistor PNPN stack architecture 204C, and FIG. 2D shows another side-view diagram 200D of multi-transistor PNNP stack architecture 204D. Further, the various multi-transistor stack architectures shown in FIGS. 2A-2D along with various components related thereto are associated with the bitcell architecture 104A in FIG. 1A.

As shown in FIG. 2A, the multi-transistor PPNN stack architecture 204A may refer to a P-over-P-over-N-over-N architecture having NMOS transistors (T1, T3, T5, T6) that are arranged to provide passgate transistors (T1, T6) and cross-coupled pull-down transistors (T3, T5) in a manner as described in reference to the bitcell architecture 104A in FIG. 1A. For instance, transistors (T1, T3) may be coupled in series between the first bitline (BL) and ground, and transistors (T6, T5) may be coupled in series between the second bitline (BLB) and ground. The gate of transistor (T3) may be coupled to node (B), which is disposed between transistors (T4, T5), and also, the gate of transistor (T5) may be coupled to node (A), which is disposed between transistors (T2, T3). Thus, the gates of transistors (T3, T5) may be cross-coupled to nodes (B, A) of the P-over-P-over-N-over-N architecture 204A. Moreover, the wordline (WL) may be coupled to the gates of the passgate transistors (T1, T6) for activation thereof.

In some implementations, the multi-transistor PPNN stack architecture 204A may be fabricated in a single monolithic semiconductor die with the P-over-P-over-N-over-N stack configuration provided as a multi-transistor stack, such as, e.g., a four-transistor PPNN-FET stack. In FIG. 2A, the multi-transistor PPNN-FET stack may include multiple nano-sheet (NS) or Fin-FET layers, such as, e.g., a first nano-sheet or FinFET (NS_1), a second nano-sheet or FinFET (NS_2), a third nano-sheet or FinFET (NS_3) and a fourth nano-sheet or FinFET (NS_4) that are stacked one on top of another. In some instances, the PPNN nano-sheets or FinFETs (NS_1, NS_2, NS_3, NS_4) may include gate portions that are coupled to different circuit components of the P-over-P-over-N-over-N architecture 204A along with local-interconnect portions. For instance, the NFET portions of transistors (T3, T5) may be coupled to VSS (or ground), the PFET portions of transistors (T2, T4) may be coupled to VDD, and the gate portions along with the local-interconnects may be cross-coupled to nodes (A, B). Also, in some instances, the NFET portions of passgate transistors (T1, T6) may be coupled between the wordline (WL) at their gates and the bitlines (BL, BLB) at their drains, respectively.

As shown in FIG. 2B, the multi-transistor NPPN stack architecture 204B may refer to an N-over-P-over-P-over-N architecture having NMOS transistors (T1, T3, T5, T6) that are arranged to provide passgate transistors (T1, T6) and cross-coupled pull-down transistors (T3, T5) in a manner as described in reference to the bitcell architecture 104A in FIG. 1A. For instance, transistors (T1, T3) may be coupled in series between the first bitline (BL) and ground, and transistors (T6, T5) may be coupled in series between the second bitline (BLB) and ground. The gate of transistor (T3) may be coupled to node (B), which is disposed between transistors (T4, T5), and also, the gate of transistor (T5) may be coupled to node (A), which is disposed between transistors (T2, T3). Thus, the gates of transistors (T3, T5) may be cross-coupled to nodes (B, A) of the N-over-P-over-P-over-N architecture 204A. Moreover, the wordline (WL) may be coupled to the gates of the passgate transistors (T1, T6) for activation thereof.

In some implementations, the multi-transistor NPPN stack architecture 204B may be fabricated in a single monolithic semiconductor die with the N-over-P-over-P-over-N stack configuration provided as a multi-transistor stack, such as, e.g., a four-transistor NPPN-FET stack. In FIG. 2B, the multi-transistor NPPN-FET stack may include multiple nano-sheet (NS) or FinFET layers, such as, e.g., a first nano-sheet or FinFET (NS_1), a second nano-sheet or FinFET (NS_2), a third nano-sheet or FinFET (NS_3) and a fourth nano-sheet or FinFET (NS_4) that are stacked one on top of another. In some instances, the NPPN nano-sheets or FinFETs (NS_1, NS_2, NS_3, NS_4) may include gate portions that are coupled to different circuit components of the N-over-P-over-P-over-N architecture 204B along with local-interconnect portions. For instance, the NFET portions of transistors (T3, T5) may be coupled to VSS (or ground), the PFET portions of transistors (T2, T4) may be coupled to VDD, and the gate portions along with the local-interconnects may be cross-coupled to nodes (A, B). Also, in some instances, the NFET portions of passgate transistors (T1, T6) may be coupled between the wordline (WL) at their gates and the bitlines (BL, BLB) at their drains, respectively.

As shown in FIG. 2C, the multi-transistor PNPN stack architecture 204C may refer to a P-over-N-over-P-over-N architecture having NMOS transistors (T1, T3, T5, T6) that are arranged to provide passgate transistors (T1, T6) and cross-coupled pull-down transistors (T3, T5) in a manner as described in reference to the bitcell architecture 104A in FIG. 1A. For instance, transistors (T1, T3) may be coupled in series between the first bitline (BL) and ground, and transistors (T6, T5) may be coupled in series between the second bitline (BLB) and ground. The gate of transistor (T3) may be coupled to node (B), which is disposed between transistors (T4, T5), and also, the gate of transistor (T5) may be coupled to node (A), which is disposed between transistors (T2, T3). Thus, the gates of transistors (T3, T5) may be cross-coupled to nodes (B, A) of the P-over-N-over-P-over-N architecture 204A. Moreover, the wordline (WL) may be coupled to the gates of the passgate transistors (T1, T6) for activation thereof.

In some implementations, the multi-transistor PNPN stack architecture 204C may be fabricated in a single monolithic semiconductor die with the P-over-N-over-P-over-N stack configuration provided as a multi-transistor stack, such as, e.g., a four-transistor PNPN-FET stack. In FIG. 2C, the multi-transistor PNPN-FET stack may have multiple nano-sheet (NS) or FinFET layers, such as, e.g., a first nano-sheet or FinFET (NS_1), a second nano-sheet or FinFET (NS_2), a third nano-sheet or FinFET (NS_3) and a fourth nano-sheet or FinFET (NS_4) that are stacked one on top of another. In some instances, the PNPN nano-sheets or FinFETs (NS_1, NS_2, NS_3, NS_4) may include gate portions that are coupled to different circuit components of the P-over-N-over-P-over-N architecture 204B along with local-interconnect portions. For instance, the NFET portions of transistors (T3, T5) may be coupled to VSS (or ground), the PFET portions of transistors (T2, T4) may be coupled to VDD, and the gate portions along with the local-interconnects may be cross-coupled to nodes (A, B). Also, in some instances, the NFET portions of passgate transistors (T1, T6) may be coupled between the wordline (WL) at their gates and the bitlines (BL, BLB) at their drains, respectively.

As shown in FIG. 2D, the multi-transistor PNNP stack architecture 204D may refer to a P-over-N-over-N-over-P architecture having NMOS transistors (T1, T3, T5, T6) that are arranged to provide passgate transistors (T1, T6) and cross-coupled pull-down transistors (T3, T5) in a manner as described in reference to the bitcell architecture 104A in FIG. 1A. For instance, transistors (T1, T3) may be coupled in series between the first bitline (BL) and ground, and transistors (T6, T5) may be coupled in series between the second bitline (BLB) and ground. The gate of transistor (T3) may be coupled to node (B), which is disposed between transistors (T4, T5), and also, the gate of transistor (T5) may be coupled to node (A), which is disposed between transistors (T2, T3). Thus, the gates of transistors (T3, T5) may be cross-coupled to nodes (A, B) of the P-over-N-over-N- over-P architecture 204A. Moreover, the wordline (WL) may be coupled to the gates of the passgate transistors (T1, T6) for activation thereof.

In some implementations, the multi-transistor PNNP stack architecture 204D may be fabricated in a single monolithic semiconductor die with the P-over-N-over-N-over-P stack configuration provided as a multi-transistor stack, such as, e.g., a four-transistor PNNP-FET stack. In FIG. 2D, the multi-transistor PNNP-FET stack may have multiple nano-sheet (NS) or FinFET layers, such as, e.g., a first nano-sheet or FinFET (NS_1), a second nano-sheet or FinFET (NS_2), a third nano-sheet or FinFET (NS_3) and a fourth nano-sheet or FinFET (NS_4) that are stacked one on top of another. In some instances, the PNNP nano-sheets or FinFETs (NS_1, NS_2, NS_3, NS_4) may include gate portions that are coupled to different circuit components of the P-over-N-over-N-over-P architecture 204D along with local-interconnect portions. For instance, the NFET portions of transistors (T3, T5) may be coupled to VSS (or ground), the PFET portions of transistors (T2, T4) may be coupled to VDD, and the gate portions along with the local-interconnects may be cross-coupled to nodes (A, B). Also, in some instances, the NFET portions of passgate transistors (T1, T6) may be coupled between the wordline (WL) at their gates and the bitlines (BL, BLB) at their drains, respectively.

Also, as shown in reference to FIGS. 2A-2D, any unused P-over-P multi-transistor stacks are referred to as dummy cells and may be left floating or etched out.

In various implementations, in reference to FIGS. 2A-2D, the multi-transistor stack bitcell architecture may refer to a device having multiple transistors in a single stack that are arranged as a cross-coupled bitcell latch, wherein the multiple transistors may be disposed in a multi-transistor stack configuration that is formed within a single monolithic semiconductor die. The multiple transistors may include at least four transistors that are disposed in the single stack within the single monolithic semiconductor die, and also, the multiple transistors may be arranged as a bitcell for single-port memory applications.

The multiple transistors may include multiple N-type transistors and multiple P-type transistors. In various implementations, the multi-transistor stack configuration refers to various different stack combinations, such as, e.g., a P-over-P-over-N-over-N (PPNN) stack configuration, an N-over-P-over-P-over-N(NPPN) stack configuration, a P-over-N-over-N-over-P (PNNP) stack configuration, and/or a P-over-N-over-P-over-N (PNPN) stack configuration. Moreover, in various implementations, the multiple transistors include a pair of N-type transistors and a pair of P-type transistors that are configured to form two inverter pairs by combining a first N-type transistor from the pair of N-type transistors and a first P-type transistor from the pair of P-type transistors to form a first inverter pair of the two inverter pairs and by combining a second N-type transistor from the pair of N-type transistors and a second P-type transistor from the pair of P-type transistors to form a second inverter pair of the two inverter pairs. Further, the two inverter pairs may be cross-coupled on sides thereof so as to provide two cross-coupled inverters that are utilized as the cross-coupled bitcell latch. Moreover, the multiple transistors include a first passgate and a second passgate for the bitcell, wherein the first passgate is coupled between a first bitline and a first inverter of the two cross-coupled inverters, and wherein the second passgate is coupled between a second bitline and a second inverter of the two cross-coupled inverters. Also, gates of the first passgate and the second passgate are coupled to a wordline for the bitcell. Also, as described herein, the multiple transistors may include field-effect transistors (FET) including P-type FET (PFET) and N-type FET (NFET).

Figure 3A:
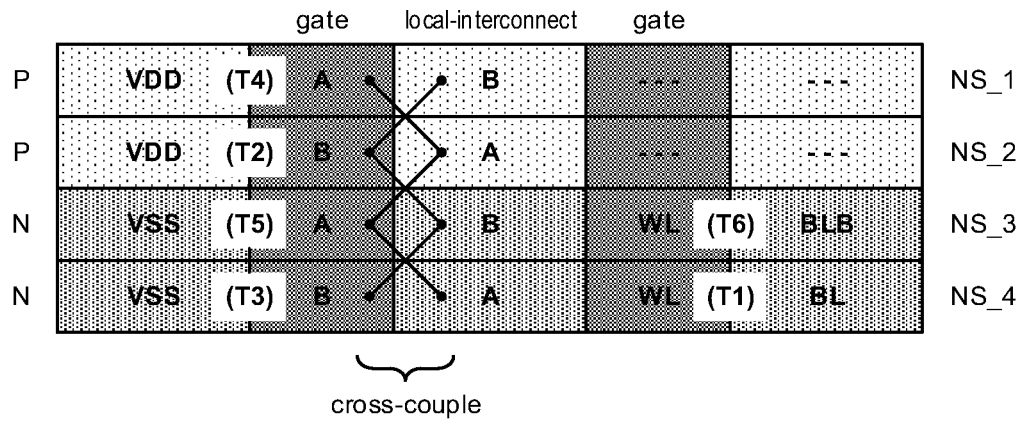
FIGS. 3A-3D illustrate various diagrams of multi-transistor stack architecture in accordance with various implementations described herein.
Figure 3B:
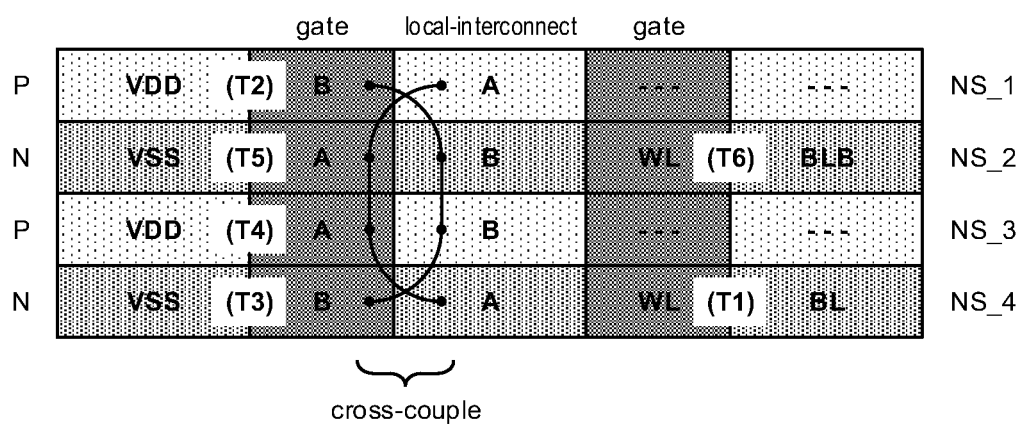
Figure 3C:
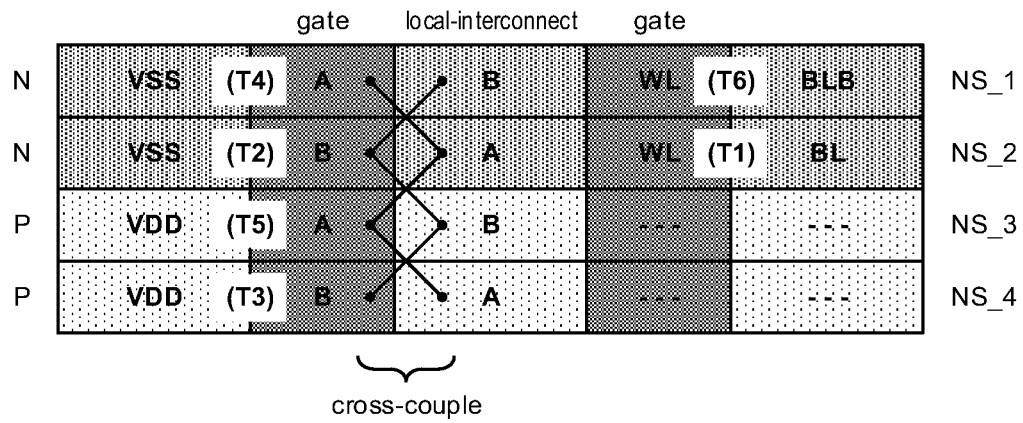
Figure 3D:
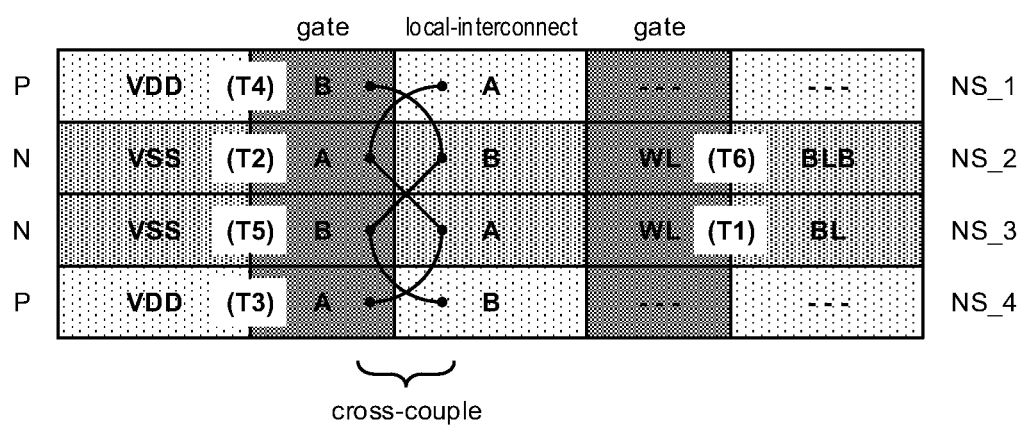

FIGS. 3A-3D illustrate various diagrams of multi-transistor stack architecture in accordance with various implementations described herein. For instance, in particular, FIG. 3A shows a side-view diagram 300A of multi-transistor PPNN stack architecture 304A, FIG. 3B shows another side-view diagram 300B of multi-transistor PNPN stack architecture 304B, FIG. 3C shows another side-view diagram 300C of multi-transistor NNPP stack architecture 304C, and FIG. 3D shows another side-view diagram 300D of multi-transistor PNNP stack architecture 304D. Further, the various multi-transistor stack architectures shown in FIGS. 3A-3D along with various components related thereto are associated with the bitcell architecture 104A in FIG. 1A.

As shown in FIG. 3A, the multi-transistor PPNN stack architecture 304A may refer to a P-over-P-over-N-over-N architecture having NMOS transistors (T1, T3, T5, T6) that are arranged to provide passgate transistors (T1, T6) and cross-coupled pull-down transistors (T3, T5) in a manner as described in reference to the bitcell architecture 104A in FIG. 1A. For instance, transistors (T1, T3) may be coupled in series between the first bitline (BL) and ground, and transistors (T6, T5) may be coupled in series between the second bitline (BLB) and ground. The gate of transistor (T3) may be coupled to node (B), which is disposed between transistors (T4, T5), and also, the gate of transistor (T5) may be coupled to node (A), which is disposed between transistors (T2, T3). Thus, the gates of transistors (T3, T5) may be cross-coupled to nodes (B, A) of the P-over-P-over-N-over-N architecture 304A. Moreover, the wordline (WL) may be coupled to the gates of the passgate transistors (T1, T6) for activation thereof.

In some implementations, the multi-transistor PPNN stack architecture 304A may be fabricated in a single monolithic semiconductor die with the P-over-P-over-N-over-N stack configuration provided as a multi-transistor stack, such as, e.g., a four-transistor PPNN-FET stack. In FIG. 3A, the multi-transistor PPNN-FET stack may include multiple nano-sheet or FinFET (NS) layers, such as, e.g., a first nano-sheet or FinFET (NS_1), a second nano-sheet or FinFET (NS_2), a third nano-sheet or FinFET (NS_3) and a fourth nano-sheet or FinFET (NS_4) that are stacked one on top of another. In some instances, the PPNN nano-sheets or FinFETs (NS_1, NS_2, NS_3, NS_4) may include gate portions that are coupled to different circuit components of the P-over-P-over-N-over-N architecture 304A along with local-interconnect portions. For instance, the NFET portions of transistors (T3, T5) may be coupled to VSS (or ground), the PFET portions of transistors (T2, T4) may be coupled to VDD, and the gate portions along with the local-interconnects may be cross-coupled to nodes (A, B). Also, in some instances, the NFET portions of passgate transistors (T1, T6) may be coupled between the wordline (WL) at their gates and the bitlines (BL, BLB) at their drains, respectively.

As shown in FIG. 3B, the multi-transistor PNPN stack architecture 304B may refer to a P-over-N-over-P-over-N architecture having NMOS transistors (T1, T3, T5, T6) that are arranged to provide passgate transistors (T1, T6) and cross-coupled pull-down transistors (T3, T5) in a manner as described in reference to the bitcell architecture 104A in FIG. 1A. For instance, transistors (T1, T3) may be coupled in series between the first bitline (BL) and ground, and transistors (T6, T5) may be coupled in series between the second bitline (BLB) and ground. The gate of transistor (T3) may be coupled to node (B), which is disposed between transistors (T4, T5), and also, the gate of transistor (T5) may be coupled to node (A), which is disposed between transistors (T2, T3). Thus, the gates of transistors (T3, T5) may be cross-coupled to nodes (B, A) of the P-over-N-over-P-over-N architecture 304B. Moreover, the wordline (WL) may be coupled to the gates of the passgate transistors (T1, T6) for activation thereof.

In some implementations, the multi-transistor PNPN stack architecture 304B may be fabricated in a single monolithic semiconductor die with the P-over-N-over-P-over-N stack configuration provided as a multi-transistor stack, such as, e.g., a four-transistor PNPN-FET stack. In FIG. 3B, the multi-transistor PNPN-FET stack may include multiple nano-sheet (NS) or FinFET layers, such as, e.g., a first nano-sheet or FinFET (NS_1), a second nano-sheet or FinFET (NS_2), a third nano-sheet or FinFET (NS_3) and a fourth nano-sheet or FinFET (NS_4) that are stacked one on top of another. In some instances, the PNPN nano-sheets or FinFETs (NS_1, NS_2, NS_3, NS_4) may include gate portions that are coupled to different circuit components of the P-over-N-over-P-over-N architecture 304B along with local-interconnect portions. For instance, the NFET portions of transistors (T3, T5) may be coupled to VSS (or ground), the PFET portions of transistors (T2, T4) may be coupled to VDD, and the gate portions along with the local-interconnects may be cross-coupled to nodes (A, B). Also, in some instances, the NFET portions of passgate transistors (T1, T6) may be coupled between the wordline (WL) at their gates and the bitlines (BL, BLB) at their drains, respectively.

As shown in FIG. 3C, the multi-transistor NNPP stack architecture 304C may refer to an N-over-N-over-P-over-P architecture having NMOS transistors (T1, T3, T5, T6) that are arranged to provide passgate transistors (T1, T6) and cross-coupled pull-down transistors (T3, T5) in a manner as described in reference to the bitcell architecture 104A in FIG. 1A. For instance, transistors (T1, T3) may be coupled in series between the first bitline (BL) and ground, and transistors (T6, T5) may be coupled in series between the second bitline (BLB) and ground. The gate of transistor (T3) may be coupled to node (B), which is disposed between transistors (T4, T5), and also, the gate of transistor (T5) may be coupled to node (A), which is disposed between transistors (T2, T3). Thus, the gates of transistors (T3, T5) may be cross-coupled to nodes (B, A) of the N-over-N-over-P-over-P architecture 304C. Moreover, the wordline (WL) may be coupled to the gates of the passgate transistors (T1, T6) for activation thereof.

In some implementations, the multi-transistor NNPP stack architecture 304C may be fabricated in a single monolithic semiconductor die with the N-over-N-over-P-over-P stack configuration provided as a multi-transistor stack, such as, e.g., a four-transistor NNPP-FET stack. In FIG. 3C, the multi-transistor NNPP-FET stack may have multiple nano-sheet (NS) or FinFET layers, such as, e.g., a first nano-sheet or FinFET (NS_1), a second nano-sheet or FinFET (NS_2), a third nano-sheet or FinFET (NS_3) and a fourth nano-sheet or FinFET (NS_4) that are stacked one on top of another. In some instances, the NNPP nano-sheets or FinFETs (NS_1, NS_2, NS_3, NS_4) may include gate portions that are coupled to different circuit components of the N-over-N-over-P-over-P architecture 304C along with local-interconnect portions. For instance, the NFET portions of transistors (T3, T5) may be coupled to VSS (or ground), the PFET portions of transistors (T2, T4) may be coupled to VDD, and the gate portions along with the local-interconnects may be cross-coupled to nodes (A, B). Also, in some instances, the NFET portions of passgate transistors (T1, T6) may be coupled between the wordline (WL) at their gates and the bitlines (BL, BLB) at their drains, respectively.

As shown in FIG. 3D, the multi-transistor PNNP stack architecture 304D may refer to a P-over-N-over-N-over-P architecture having NMOS transistors (T1, T3, T5, T6) that are arranged to provide passgate transistors (T1, T6) and cross-coupled pull-down transistors (T3, T5) in a manner as described in reference to the bitcell architecture 104A in FIG. 1A. For instance, transistors (T1, T3) may be coupled in series between the first bitline (BL) and ground, and transistors (T6, T5) may be coupled in series between the second bitline (BLB) and ground. The gate of transistor (T3) may be coupled to node (B), which is disposed between transistors (T4, T5), and also, the gate of transistor (T5) may be coupled to node (A), which is disposed between transistors (T2, T3). Thus, the gates of transistors (T3, T5) may be cross-coupled to nodes (B, A) of the P-over-N-over-N-over-P architecture 304D. Moreover, the wordline (WL) may be coupled to the gates of the passgate transistors (T1, T6) for activation thereof.

In some implementations, the multi-transistor PNNP stack architecture 304D may be fabricated in a single monolithic semiconductor die with the P-over-N-over-N-over-P stack configuration provided as a multi-transistor stack, such as, e.g., a four-transistor PNNP-FET stack. In FIG. 3D, the multi-transistor PNNP-FET stack may have multiple nano-sheet (NS) or FinFET layers, such as, e.g., a first nano-sheet or FinFET (NS_1), a second nano-sheet or FinFET (NS_2), a third nano-sheet or FinFET (NS_3) and a fourth nano-sheet or FinFET (NS_4) that are stacked one on top of another. In some instances, the PNNP nano-sheets or FinFETs (NS_1, NS_2, NS_3, NS_4) may include gate portions that are coupled to different circuit components of the P-over-N-over-N-over-P architecture 304D along with local-interconnect portions. For instance, the NFET portions of transistors (T3, T5) may be coupled to VSS (or ground), the PFET portions of transistors (T2, T4) may be coupled to VDD, and the gate portions along with the local-interconnects may be cross-coupled to nodes (A, B). Also, in some instances, the NFET portions of passgate transistors (T1, T6) may be coupled between the wordline (WL) at their gates and the bitlines (BL, BLB) at their drains, respectively.

Also, as shown in reference to FIGS. 3A-3D, any unused P-over-P multi-transistor stacks are referred to as dummy cells and may be left floating or etched out.

In various implementations, in reference to FIGS. 3A-3D, the multi-transistor stack bitcell architecture may refer to a bitcell device having a pair of N-type devices and a pair of P-type devices, wherein the pair of N-type devices and the pair of P-type devices may be formed in a single stack within a single monolithic semiconductor die. The bitcell device may be arranged in a physical structure in various single stack configurations, such as, e.g., various combinations of P-type and N-type layering of the single stack. In some instances, the pair of N-type devices and the pair of P-type devices may be disposed in the single stack with a P-over-P-over-N-over-N stack configuration. In other instances, the pair of N-type devices and the pair of P-type devices may be disposed in the single stack with an N-over-P-over-P-over-N stack configuration. In other instances, the pair of N-type devices and the pair of P-type devices may be disposed in the single stack with a P-over-N-over-N-over-P stack configuration. Also, in other instances, the pair of N-type devices and the pair of P-type devices may be disposed in the single stack with a P-over-N-over-P-over-N stack configuration.

Moreover, in various implementations, the pair of N-type devices and the pair of P-type devices are cross-coupled on sides thereof so as to provide two cross-coupled inverters that are utilized as a latch for the bitcell. Also, the bitcell device may include one or more passgates, such as, e.g., a first passgate and a second passgate, wherein the first passgate is coupled between a first bitline and a first inverter of the two cross-coupled inverters, and wherein the second passgate is coupled between a second bitline and a second inverter of the two cross-coupled inverters. Also, gates of the first passgate and the second passgate may be coupled to a wordline for the bitcell. Further, as described herein, the pair of N-type devices may refer to a pair of NFET devices, and also, the pair of P-type devices may refer to a pair of PFET devices.

Figure 4A:
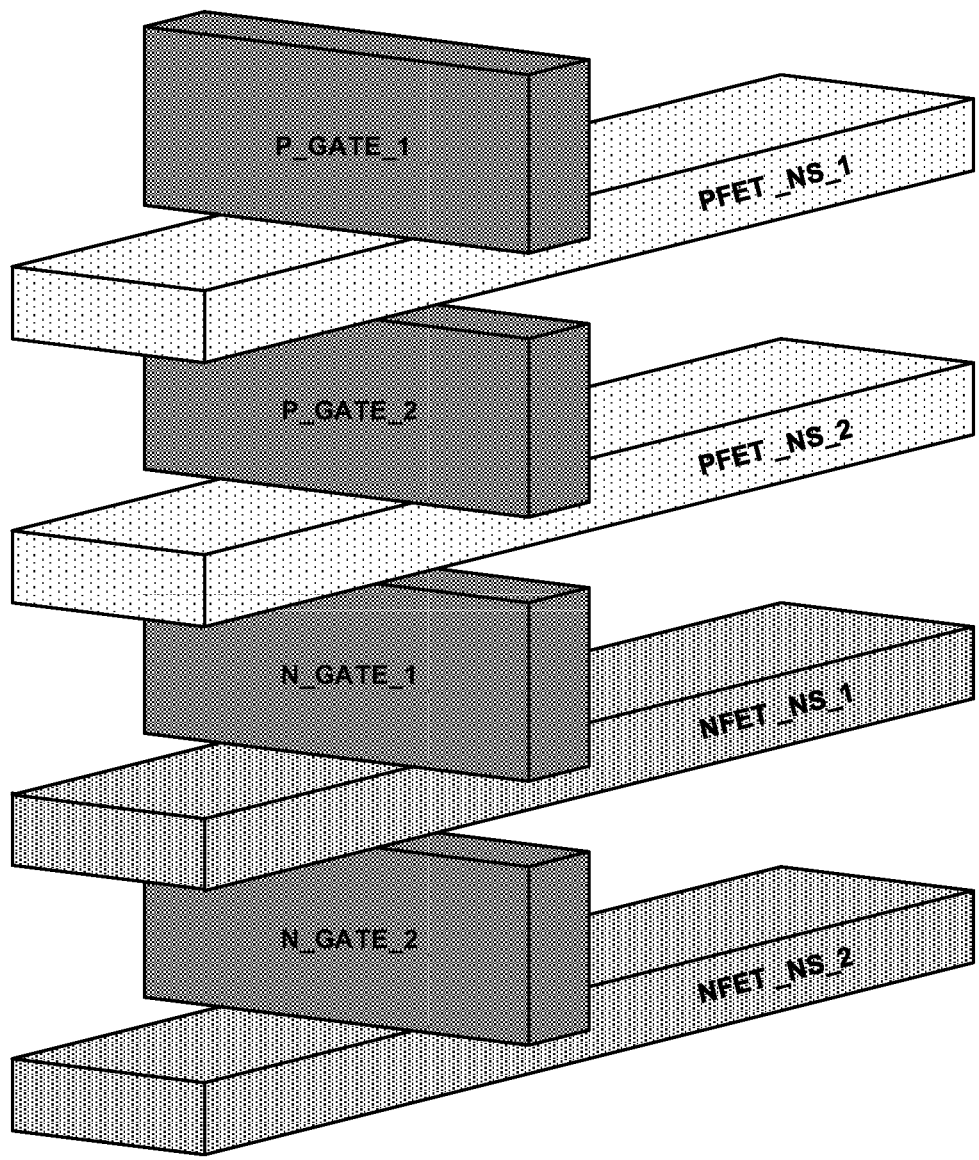
FIGS. 4A-4C illustrate various diagrams of split-gate transistor architecture in accordance with various implementations described herein.
Figure 4B:
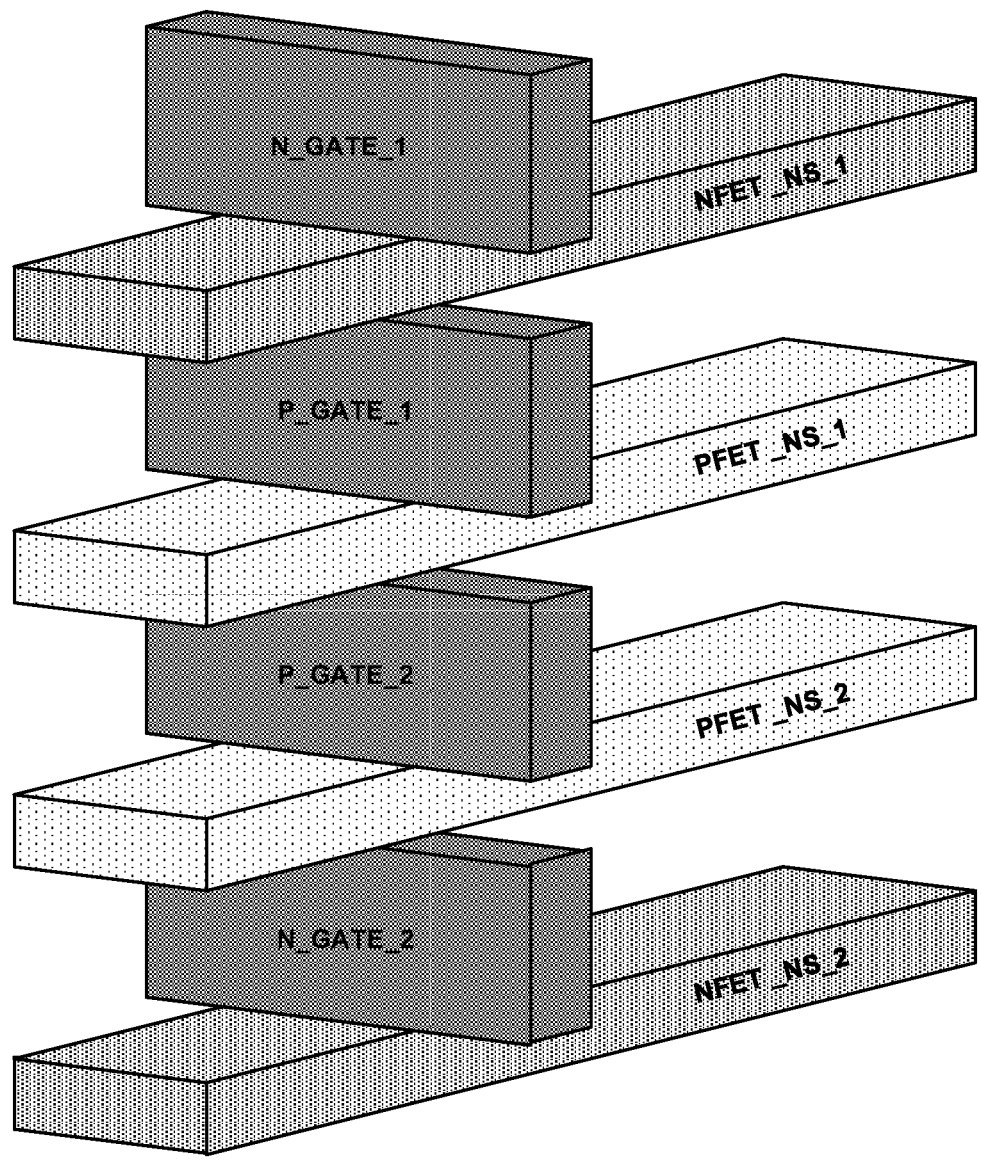
Figure 4C:
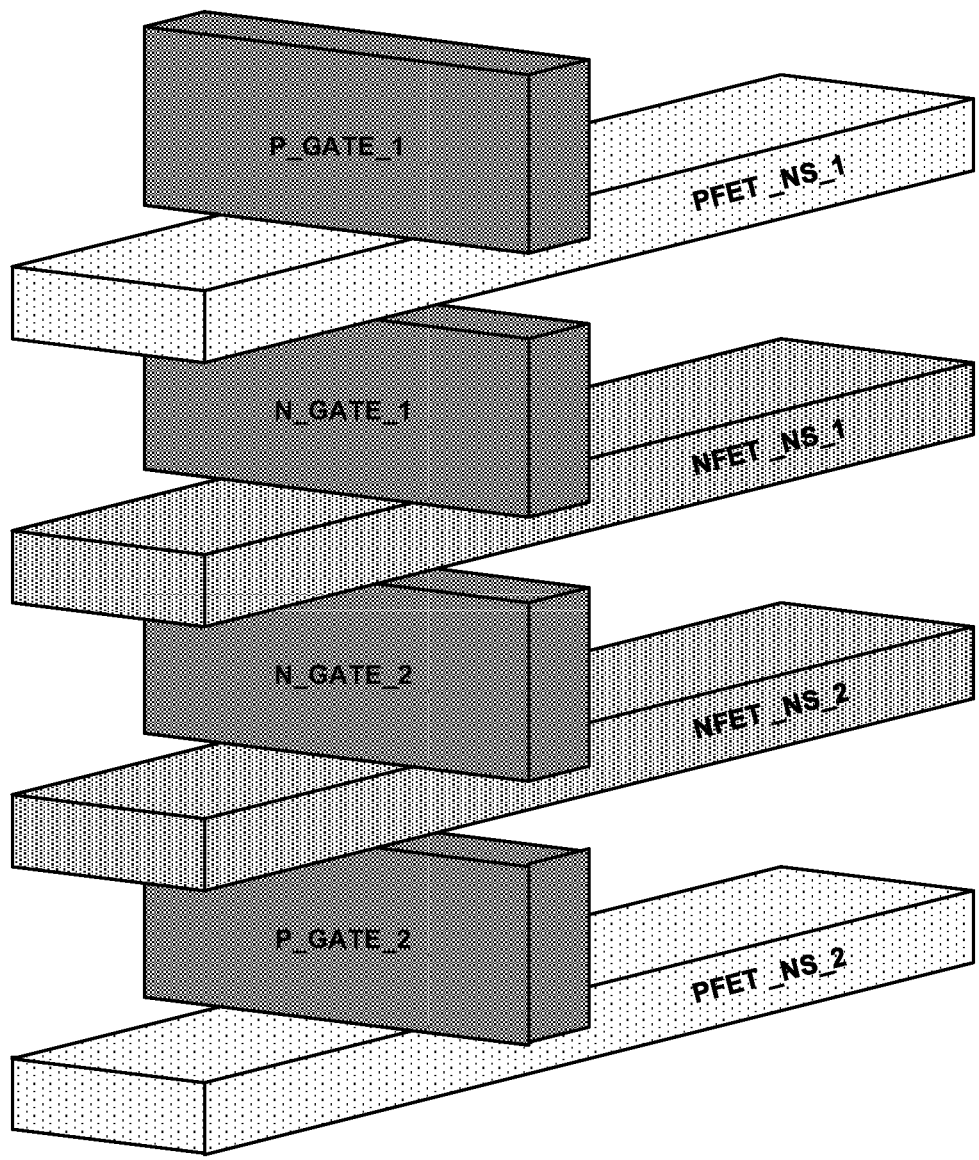

FIGS. 4A-4C illustrate various diagrams of split-gate transistor architecture in accordance with implementations described herein. For instance, in particular, FIG. 4A shows a diagram 400A of PPNN split-gate transistor architecture 404A, FIG. 4B shows a diagram 400B of NPPN split-gate transistor architecture 404B, and FIG. 4C shows a diagram 400C of PNNP split-gate transistor architecture 404C. The split-gate architectures 404A, 404B, 404C as shown in FIGS. 4A-4C and the various components related thereto are related to the bitcell architecture 104A in FIG. 1A and the multi-transistor stack architectures described in FIGS. 2A-2D and 3A-3D.

As shown in FIG. 4A, the P-over-P-over-N-over-N (PPNN) split-gate related transistor architecture 404A may include multiple transistors (e.g., 2 PFET devices and 2 NFET devices) that are arranged in a multi-transistor stack configuration. For instance, a first PFET may be formed in a first PFET nano-sheet or FinFET (PFET_NS_1) and a second PFET may be formed in a second PFET nano-sheet or FinFET (NFET_NS_2), which are disposed in the single stack. Also, a first NFET may be formed in a first NFET nano-sheet or FinFET (NFET_NS_1) and a second NFET may be formed in a second NFET nano-sheet or FinFET (NFET_NS_2), which are disposed in the single stack. The split-gate architecture 404A may have multiple gates (e.g., poly gate lines) coupled to the multiple transistors. In some instances, a first P-gate (P_GATE_1) may be coupled to the PFET_NS_1 device and a second gate (P_GATE_2) may be coupled to the PFET_NS_2 device, and also, a first N-gate (N_GATE_1) may be coupled to the NFET_NS_1 device and a second N-gate (N_GATE_2) may be coupled to the NFET_NS_2 device. This arrangement provides the PPNN stack configuration that is manufactured and/or formed in a same single monolithic semiconductor die. Also, in various implementations, the pair of P-type devices and the pair of N-type devices may be cross-coupled on sides thereof so as to provide two cross-coupled inverters that may be utilized as a latch for the bitcell.

As shown in FIG. 4B, the N-over-P-over-P-over-N (NPPN) split-gate related transistor architecture 404B may include multiple transistors (e.g., 2 PFET devices and 2 NFET devices) that are arranged in a multi-transistor stack configuration. For instance, a first PFET may be formed in a first PFET nano-sheet or FinFET (PFET_NS_1) and a second PFET may be formed in a second PFET nano-sheet or FinFET (NFET_NS_2), which are disposed in the single stack. Also, a first NFET may be formed in a first NFET nano-sheet or FinFET (NFET_NS_1) and a second NFET may be formed in a second NFET nano-sheet or FinFET (NFET_NS_2), which are disposed in the single stack. The split-gate architecture 404B may have multiple gates (e.g., poly gate lines) coupled to the multiple transistors. In some instances, a first P-gate (P_GATE_1) may be coupled to the PFET_NS_1 device and a second gate (P_GATE_2) may be coupled to the PFET_NS_2 device, and also, a first N-gate (N_GATE_1) may be coupled to the NFET_NS_1 device and a second N-gate (N_GATE_2) may be coupled to the NFET_NS_2 device. This arrangement provides the NPPN stack configuration that is manufactured and/or formed in a same single monolithic semiconductor die. Also, in various implementations, the pair of P-type devices and the pair of N-type devices may be cross-coupled on sides thereof so as to provide two cross-coupled inverters that may be utilized as a latch for the bitcell.

As shown in FIG. 4C, the P-over-N-over-N-over-P (PNNP) split-gate related transistor architecture 404C may include multiple transistors (e.g., 2 PFET devices and 2 NFET devices) that are arranged in a multi-transistor stack configuration. For instance, a first PFET may be formed in a first PFET nano-sheet or FinFET (PFET_NS_1) and a second PFET may be formed in a second PFET nano-sheet or FinFET (NFET_NS_2), which are disposed in the single stack. Also, a first NFET may be formed in a first NFET nano-sheet or FinFET (NFET_NS_1) and a second NFET may be formed in a second NFET nano-sheet or FinFET (NFET_NS_2), which are disposed in the single stack. The split-gate architecture 404C includes multiple gates (e.g., poly gate lines) coupled to the multiple transistors. In some instances, a first P-gate (P_GATE_1) may be coupled to the PFET_NS_1 device and a second gate (P_GATE_2) may be coupled to the PFET_NS_2 device, and also, a first N-gate (N_GATE_1) may be coupled to the NFET_NS_1 device and a second N-gate (N_GATE_2) may be coupled to the NFET_NS_2 device. This arrangement provides the PNNP stack configuration that is manufactured and/or formed in a same single monolithic semiconductor die. Also, in various implementations, the pair of P-type devices and the pair of N-type devices may be cross-coupled on sides thereof so as to provide two cross-coupled inverters that may be utilized as a latch for the bitcell.

In some implementations, in reference to FIGS. 4A-4C, the various split-gate architectures 404A, 404B, 404C may be replaced with common gate architecture, wherein the one or more transistors (PFET_NS_1 and/or PFET_NS_2 and/or NFET_NS_1 and/or NFET_NS_2) may be arranged and/or configured to share single gate structure. As such, in various instances, the pair of stacked PFET devices and/or the pair of stacked NFET devices may be configured to share a single common gate structure.

Figure 5:
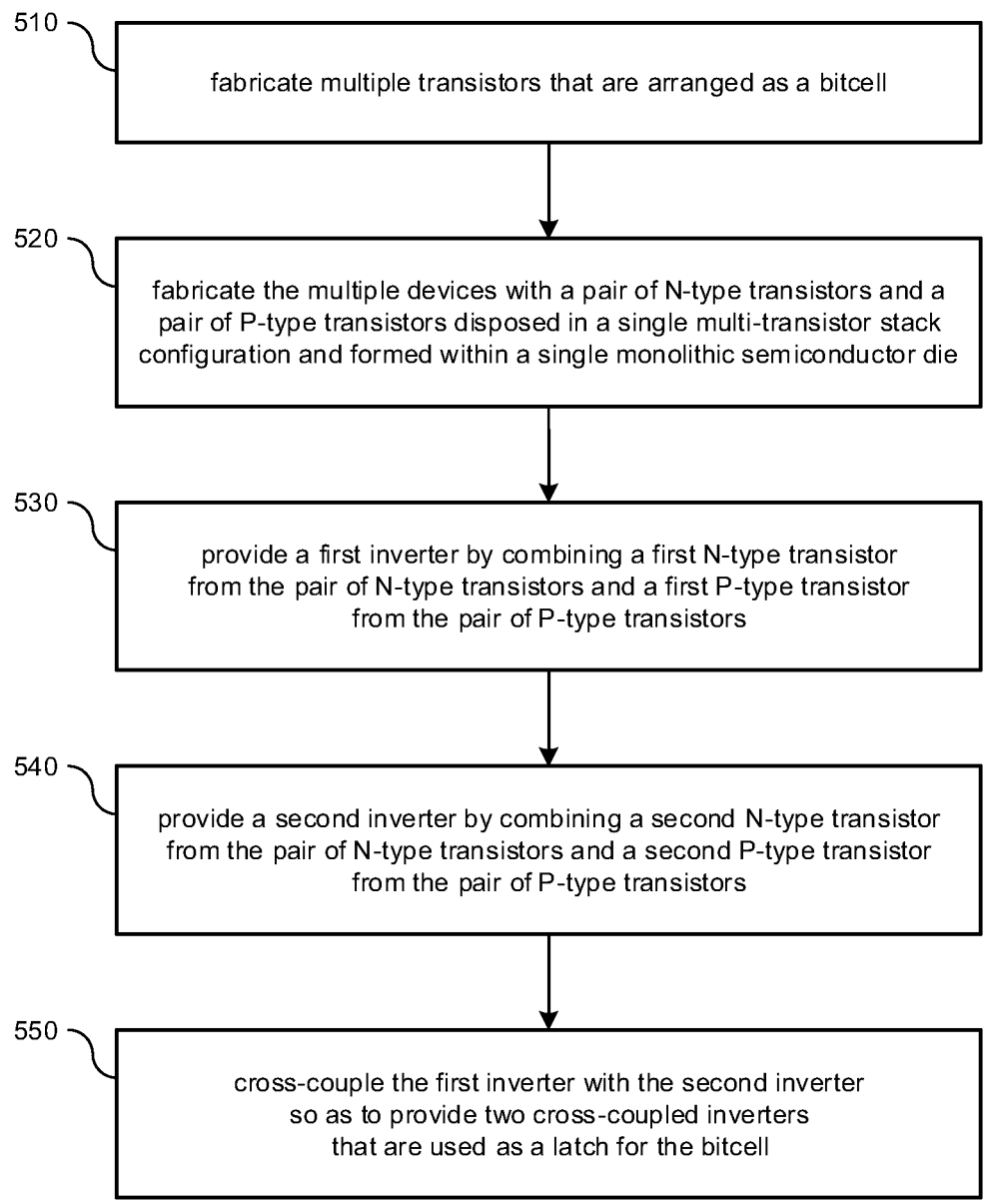
FIG. 5 illustrates a diagram of a method for fabricating bitcell architecture in accordance with various implementations described herein.

FIG. 5 illustrates a diagram of a method 500 for fabricating bitcell architecture in accordance with various implementations described herein. In some implementations, method 500 may be configured to fabricate multi-transistor stack bitcell architecture.

It should be understood that even though the method 500 indicates a particular order of operation execution, in some cases, various particular portions of the operations may be executed in a different order, and on different systems. In other cases, additional operations and/or steps may be added to and/or omitted from method 500. Also, method 500 may be implemented in hardware and/or software. If implemented in hardware, the method 500 may be implemented with various components and/or circuitry, as described herein in reference to FIGS. 1-4C. Also, if implemented in software, method 500 may be implemented as a program and/or software instruction process configured for providing bitcell architecture schemes and techniques, as described herein. Further, if implemented in software, various instructions associated with implementing method 500 may be stored in memory and/or a database. For instance, various types of computing devices having a processor and memory may be configured to perform method 500.

In various implementations, method 500 may refer to a method of designing, providing, building, fabricating and/or manufacturing various bitcell related structures as an integrated device that may involve use of various components and materials described herein. Also, the bitcells may be integrated with various computing circuitry and related components on a single chip, and the non-volatile memory bitcells may be implemented in various embedded systems for various electronic, mobile and/or Internet-of-things (IoT) applications, including remote sensor nodes.

At block 510, method 500 may fabricate multiple transistors that are arranged as a bitcell. At block 520, method 500 may fabricate the multiple devices with a pair of N-type transistors and a pair of P-type transistors disposed in a single multi-transistor stack configuration and formed within the same, single monolithic semiconductor die. In some instances, the multiple transistors may include at least four transistors that are disposed in the single stack within the single monolithic semiconductor die, and also, the multiple transistors may be arranged as a bitcell for single-port memory applications.

At block 530, method 500 may provide a first inverter by combining (or coupling) a first N-type transistor from the pair of N-type transistors and a first P-type transistor from the pair of P-type transistors. At block 540, method 500 may provide a second inverter by combining (or coupling) a second N-type transistor from the pair of N-type transistors and a second P-type transistor from the pair of P-type transistors.

At block 550, method 500 may cross-couple the pair of N-type transistors with the pair of P-type transistors so as to provide multiple (e.g., two) cross-coupled inverters that are used as a latch for the bitcell. In some implementations, method 500 may cross-couple the first inverter with the second inverter so as to provide multiple (e.g., two) cross-coupled inverters that are used the latch for the bitcell. In some implementations, the two inverter pairs are cross-coupled on sides thereof so as to provide the two cross-coupled inverters that are utilized as the cross-coupled bitcell latch.

In various implementations, the single multi-transistor stack configuration refers to at least one of a P-over-P-over-N-over-N stack configuration, an N-over-P-over-P-over-N stack configuration, a P-over-N-over-N-over-P stack configuration and a P-over-N-over-P-over-N stack configuration. However, it should be appreciated that various other stack configurations may be utilized so as to achieve the various bitcell fabricating schemes and techniques in a manner as described herein. Also, in some implementations, the multiple transistors may refer to field-effect transistors (FET) devices including, e.g., P-type FET (PFET) devices and N-type FET (NFET) devices.

In some implementations, the multiple transistors may include a first passgate and a second passgate for the bitcell. The first passgate may be coupled between a first bitline and a first inverter of the two cross-coupled inverters, and the second passgate may be coupled between a second bitline and a second inverter of the two cross-coupled inverters. Also, in some implementations, the gates of the first passgate and the second passgate may be coupled to a wordline for the bitcell.

Described herein are implementations of a device having multiple transistors in a single stack arranged as a cross-coupled bitcell latch. Also, IN some implementations, the multiple transistors may be disposed in a multi-transistor stack configuration that is formed within a single monolithic semiconductor die.

Described herein are various implementations of a bitcell. The bitcell may have a pair of N-type devices and a pair of P-type devices. In some implementations, the pair of N-type devices and the pair of P-type devices may be formed in a single stack within a single monolithic semiconductor die.

Described herein are various implementations of a method. The method may fabricate multiple transistors that are arranged as a bitcell. The method may fabricate the multiple devices with a pair of N-type transistors and a pair of P-type transistors disposed in a single multi-transistor stack configuration and formed within a single monolithic semiconductor die. In some implementations, the method may cross-couple the pair of N-type transistors with the pair of P-type transistors so as to provide two cross-coupled inverters that are used as a latch for the bitcell.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, specific features and acts described above are disclosed as example forms of implementing the claims.

What is claimed is:

1. A device comprising:
multiple transistors arranged in a single stack and coupled together to operate as a cross-coupled bitcell latch,
wherein the multiple transistors include N-type transistors and P-type transistors that are sequentially disposed in a P-over-N-over-N-over-P stack configuration that is formed within a single monolithic semiconductor die.

2. The device of claim 1, wherein:
the multiple transistors include at least four transistors that are disposed in the single stack within the single monolithic semiconductor die, and
the multiple transistors are arranged as a bitcell for single-port memory applications.

3. The device of claim 1, wherein:
the multiple transistors include a pair of N-type transistors and a pair of P-type transistors that are configured to form two inverter pairs by combining a first N-type transistor from the pair of N-type transistors and a first P-type transistor from the pair of P-type transistors to form a first inverter pair of the two inverter pairs and by combining a second N-type transistor from the pair of N-type transistors and a second P-type transistor from the pair of P-type transistors to form a second inverter pair of the two inverter pairs, and
the two inverter pairs are cross-coupled on sides thereof so as to provide two cross-coupled inverters that are utilized as the cross-coupled bitcell latch.

4. The device of claim 3, wherein:
the multiple transistors include a first passgate and a second passgate for the bitcell,
the first passgate is coupled between a first bitline and a first inverter of the two cross-coupled inverters, and
the second passgate is coupled between a second bitline and a second inverter of the two cross-coupled inverters.

5. The device of claim 4, wherein gates of the first passgate and the second passgate are coupled to a wordline for the bitcell.

6. The device of claim 1, wherein the multiple transistors include field-effect transistors (FET) including P-type FET (PFET) and N-type FET (NFET).

7. The device of claim 1, wherein the multiple transistors have multiple N-type transistors and multiple P-type transistors, and wherein the multi-transistor stack configuration refers to a P-over-P-over-N-over-N stack configuration.

8. The device of claim 1, wherein the multiple transistors have multiple N-type transistors and multiple P-type transistors, and wherein the multi-transistor stack configuration refers to an N-over-P-over-P-over-N stack configuration.

9. The device of claim 1, wherein the multiple transistors have multiple N-type transistors and multiple P-type transistors, and wherein the multi-transistor stack configuration refers to a P-over-N-over-P-over-N stack configuration.

10. A bitcell comprising:
a pair of N-type devices; and
a pair of P-type devices,
wherein the pair of N-type devices and the pair of P-type devices are sequentially formed in a single P-over-N-over-N-over-P stack within a single monolithic semiconductor die.

11. The bitcell of claim 10, wherein the pair of N-type devices and the pair of P-type devices are cross-coupled on sides thereof so as to provide two cross-coupled inverters that are utilized as a latch for the bitcell.

12. The bitcell of claim 11, further comprising:
a first passgate and a second passgate,
wherein the first passgate is coupled between a first bitline and a first inverter of the two cross-coupled inverters,
wherein the second passgate is coupled between a second bitline and a second inverter of the two cross-coupled inverters, and
wherein gates of the first passgate and the second passgate are coupled to a wordline for the bitcell.

13. The bitcell of claim 10, wherein the pair of N-type devices refer to a pair of N-type field-effect transistors (NFET), and wherein the pair of P-type devices refer to a pair of P-type field-effect transistors (PFET).

14. The bitcell of claim 10, wherein the pair of N-type devices and the pair of P-type devices are disposed in the single stack with a P-over-P-over-N-over-N stack configuration.

15. The bitcell of claim 10, wherein the pair of N-type devices and the pair of P-type devices are disposed in the single stack with an N-over-P-over-P-over-N stack configuration.

16. The bitcell of claim 10, wherein the pair of N-type devices and the pair of P-type devices are disposed in the single stack with a P-over-N-over-P-over-N stack configuration.

17. A method comprising:
fabricating multiple transistors that are arranged as a bitcell;
fabricating the multiple devices with a pair of N-type transistors and a pair of P-type transistors sequentially disposed in a single P-over-N-over-N-over-P stack configuration and formed within a single monolithic semiconductor die; and
cross-coupling the pair of N-type transistors with the pair of P-type transistors so as to provide two cross-coupled inverters that are used as a latch for the bitcell.

* * * * *